(12) United States Patent
Matsui (10) Patent No.: US 7,696,789 B2
(45) Date of Patent: Apr. 13, 2010

(54) HIGH-FREQUENCY SIGNAL DETECTOR

(75) Inventor: Naohiro Matsui, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 1 day.

(21) Appl. No.: 12/153,815

(22) Filed: May 23, 2008

(65) Prior Publication Data

US 2009/0021282 A1   Jan. 22, 2009

(30) Foreign Application Priority Data

May 25, 2007   (JP) .............................. 2007-139334

(51) Int. Cl.
*H03D 3/00*   (2006.01)
(52) U.S. Cl. .............................. 327/40; 327/47; 327/49; 327/65
(58) Field of Classification Search ............. 327/58–62, 327/65–67, 39, 40, 42, 47, 49; 330/258
See application file for complete search history.

(56) References Cited

U.S. PATENT DOCUMENTS

| | | | | | |
|---|---|---|---|---|---|
| 3,887,879 | A | * | 6/1975 | Radovsky | .................... 330/257 |
| 3,894,290 | A | * | 7/1975 | Schoeff | ....................... 330/257 |
| 4,591,800 | A | * | 5/1986 | Opas | ........................... 330/86 |
| 5,117,199 | A | * | 5/1992 | Wang et al. | .................. 330/252 |
| 5,488,306 | A | * | 1/1996 | Bonaccio | ..................... 324/539 |
| 5,578,964 | A | * | 11/1996 | Kim et al. | .................... 330/253 |
| 6,051,997 | A | * | 4/2000 | Yeung et al. | ................... 327/58 |
| 6,356,152 | B1 | * | 3/2002 | Jezdic et al. | ................. 330/253 |
| 2006/0244532 | A1 | * | 11/2006 | Trifonov et al. | ............. 330/258 |
| 2009/0015295 | A1 | * | 1/2009 | Aoki et al. | ..................... 327/58 |
| 2009/0201090 | A1 | * | 8/2009 | Daily et al. | ................. 330/279 |

FOREIGN PATENT DOCUMENTS

| | | |
|---|---|---|
| JP | 2003-243947 | 8/2003 |
| JP | 2006-174101 | 6/2006 |

* cited by examiner

*Primary Examiner*—Long Nguyen
*Assistant Examiner*—Shikha Goyal
(74) *Attorney, Agent, or Firm*—McGinn IP Law Group, PLLC (57) ABSTRACT

Disclosed is a high-frequency signal detector circuit including a diode detector circuit for detecting an input signal by diode detection; a differential-input/differential output amplifier with a common mode feedback circuit, the amplifier including a differential amplifying circuit for differentially receiving outputs of the diode detector circuit and outputting a differential output signal, and a common mode feedback circuit for controlling the differential amplifying circuit in such a manner that a voltage corresponding to a mid-point of the differential output signal from the differential amplifying circuit will take on a voltage identical with a prescribed voltage; and a differential-input/single-ended output amplifier for receiving the differential output signal of the differential amplifying circuit and outputting a single-ended output signal. The circuit further includes a binarization circuit for receiving the output signal of the differential-input/single-ended output amplifier and comparing the output signal with a threshold voltage to thereby binarize and output the signal. The threshold voltage is adjustably set.

20 Claims, 8 Drawing Sheets

INPUT POWER
(Pin: −60 dBm
Fin: 2.5 GHz
AM Modulation: 1 KHz
Modulation Index: 90%)

HIGH-FREQUENCY SIGNAL DETECTOR

REFERENCE TO RELATED APPLICATION

This application is based upon and claims the benefit of the priority of Japanese patent application No. 2007-139334, filed on May 25, 2007, the disclosure of which is incorporated herein in its entirety by reference thereto.

FIELD OF THE INVENTION

This invention relates to a high-frequency signal detector circuit.

BACKGROUND OF THE INVENTION

There is increasing demand for use of a high frequency signal detector or RF signal detector as a trigger signal output circuit in radio communication devices of an RFID (Radio Frequency Identification) system and DSRC (Dedicated Short-Range Communication) system, etc.

When an RF signal detector circuit is used as a trigger signal output circuit, some qualities that are sought are low power consumption, low operating voltage and a high signal detection sensitivity, etc.

Figure 7:
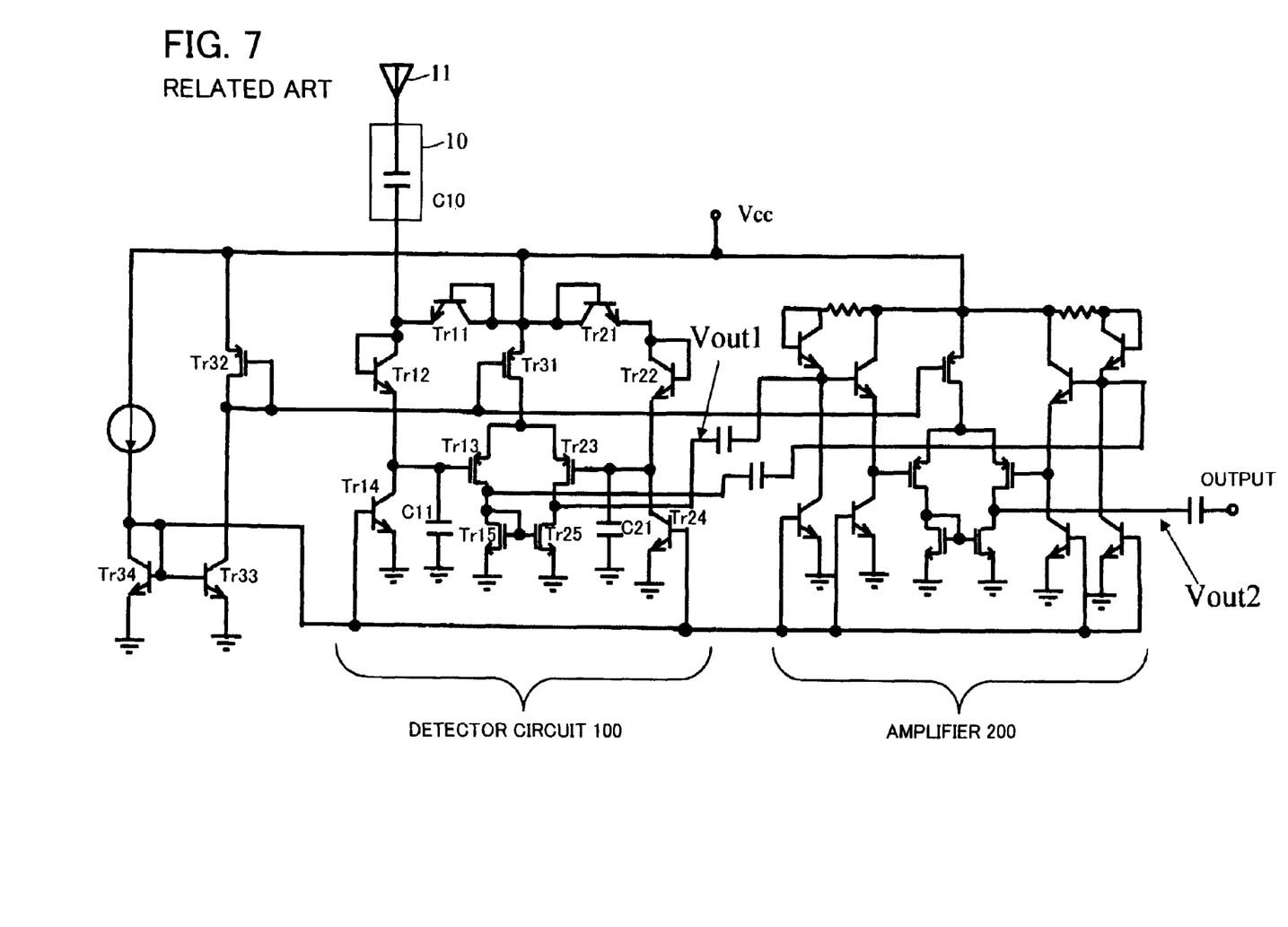
FIG. 7 is a diagram illustrating a configuration disclosed in Patent Document 1.

A configuration of the kind shown in FIG. 7 has been described in Patent Document 1 (Japanese Patent Kokai Publication No. JP-P2006-174101A) in order to satisfy this requirement. It should be noted that FIG. 7 is a configuration created based upon the content of FIGS. 1 and 3 of Patent Document 1. The configuration and operation of FIG. 7 will be described based upon the content set forth in Patent Document 1.

As shown in FIG. 7, P-channel transistors Tr13 and Tr23 having their sources coupled together, a P-channel transistor Tr31 forming a current source and N-channel transistors Tr15 and Tr25 forming a passive load (current mirror circuit) constitute a differential amplifying circuit. A first series circuit composed of diode-connected NPN bipolar transistors Tr11 and Tr12 (detector diodes) and a capacitor C11 is disposed between a power supply Vcc and ground, and an NPN bipolar transistor (current source) Tr14 is connected between the cathode of the detector diode Tr12 and ground. Further, a second series circuit composed of diode-connected NPN bipolar transistors Tr21 and Tr22 (detector diodes) and a capacitor C21 is disposed between the power supply Vcc and ground, and an NPN bipolar transistor (current source) Tr24 is connected between a cathode of the detector diode Tr22 and ground. A matching circuit 10 including a series capacitor is connected to the anode of the detector diode Tr12.

Furthermore, a bipolar transistor Tr34 having an emitter grounded and a collector and base that are connected to a current source, and bipolar transistors Tr33, Tr14 and Tr24 having emitters grounded and bases coupled together and connected to the base of the transistor Tr34, constitute a current mirror. A transistor Tr32, which has a source connected to the power supply and a drain and collector that are connected to the collector of the bipolar transistor Tr33, and a current-source transistor Tr31 constitute a current mirror.

A high-frequency signal (RF signal) received from an antenna 11 is applied to the anode of the detector diode Tr12 via the matching circuit 10 and charges the capacitor C11 upon being rectified by the detector diode Tr12. The voltage across the terminals of the capacitor C11 takes on a value that conforms to the amplitude (envelope) of the high-frequency signal. Since the high-frequency signal does not flow into the second series circuit (transistors Tr21, Tr22 and capacitor C21), the voltage across the terminals of the capacitor C21 does not rise. The difference voltage between the terminal voltages of the capacitors C11 and C21 is amplified by the differential amplifying circuit, which delivers a differential output signal Vout1 to an amplifier 200, which is the next stage. The capacitor C10 in the matching circuit 10, the diode Tr11, the detector diode Tr12 and the capacitor C11 constitute a voltage doubling circuit and, hence, the terminal voltage of the capacitor C11 takes on a voltage that is double the amplitude of the high-frequency signal. As a result, the difference between the two inputs to the differential amplifying circuit is doubled and sensitivity is improved.

It should be noted that Patent Document 2 discloses an operational transconductance amplifier (OTA) capable of operating at high speed for improving the noise characteristic, the amplifier comprising an input differential pair, a constant current source (cascode-connected transistors), a bias circuit, a common-mode feedback (CMFB) circuit and a conductance control circuit. In Patent Document 2, the CMFB circuit generates a reference current in order that the mid-point voltage of differential voltages corresponding to the differential output currents of the input differential pair will be the same voltage as a reference voltage, and a constant current circuit connected to the output pair of the differential pair and constructed by the cascode-connected transistors supplies the differential pair with a differential current mirror current that is in accordance with the reference current generated by the CMFB circuit.

[Patent Document 1] Japanese Patent Kokai Publication No. JP-P2006-174101A

[Patent Document 2] Japanese Patent Kokai Publication No. JP-P2003-243947A

The entire disclosures of Patent Documents 1 and 2 are incorporated herein by reference thereto. The following analyses are given by the present inventor.

The inventor has studied the circuit configuration illustrated in FIG. 7, and the results of these studies will now be described.

As mentioned above, the signal received by the antenna 11 is applied to the detector circuit 100, in which amplitude information is detected by the diode detector circuit (transistors Tr11, Tr12, capacitor C11, transistors Tr21, Tr22 and capacitor C21) and the signal is amplified by the differential amplifying circuit (differential-input/single-ended output amplifying circuit). The resultant signal is supplied to the amplifier 200 constituting the next stage.

The output section of the detector circuit 100 outputs the differential signal Vout1 irrespective of the fact that it is a differential-input/single-ended output amplifying circuit. That is, the output section includes a diode detector circuit of half-wave voltage doubling type (NPN diodes in two stages) and constant current sources (transistors Tr14, Tr24), and the detector output section has the capacitors (C11, C21) for smoothing voltage. The diode detector circuit performs envelope detection, i.e., demodulates the amplitude-modulated signal and detects an AM-type burst (intermittent) signal component with regard to a certain frequency carrier. The next stage has a differential-input/single-ended output amplifier of the PNP input so as to make low-voltage drive possible. This amplifier amplifies the detection signal.

The amplifier in the output section of the detector circuit 100 is the amplifier of a single-ended output and produces the quasi differential output Vout1 artificially. This differential output Vout1 is supplied to the amplifier 200, which further amplifies the detection signal to thereby finally obtain a detection signal output Vout2.

However, the output signal Vout1 is not a pure differential signal; in view of the circuit configuration and principle of operation, the signal is substantially a single-ended signal. Although it may appear at a glance that the circuit outputs a differential signal, this is not the case.

With such a circuit configuration and principle of operation, the common mode rejection ratio (CMRR) and power supply rejection ratio (PSRR) are decided by the capability of the amplifier in the initial stage. Consequently, the CMRR and PSRR of the entire detector circuit 100 deteriorate. If it is attempted to raise the gain of the entire detector circuit 100 in order to improve signal detection sensitivity, the fact that the CMRR and PSRR are poor results in unstable operation of the detector circuit, such as abnormal oscillation and a decline in the SNR (signal-to-noise ratio) of the output signal, and a high detection sensitivity cannot be achieved.

On the other hand, in a case where the detection signal that has been output from the amplifier is binarized, a problem which arises is that depending upon the status of the SNR of the amplifier output, this can lead to malfunction unless the threshold value of the binarization circuit is adjusted skillfully.

Thus, although it appears at a glance that the output section Vout1 of the detector circuit 100 outputs a differential signal, the amplifier section of the detector circuit 100 is a single-ended signal output circuit and does not operate as one that outputs a differential signal.

Since the output of the amplifier section of the detector circuit 100 is not a fully differential output signal, the CMRR and PSRR are poor and it is difficult to achieve stable operation when a high gain is set. This point will be described later in comparison with the present invention.

SUMMARY OF THE DISCLOSURE

The invention disclosed in this application has the configuration set forth below in order to solve the aforesaid problems.

A detector circuit according to an aspect of the present invention comprises: a diode detector circuit for performing envelope detection of a received signal;

a differential-input/differential output amplifier with a common mode feedback circuit; said amplifier including: a differential amplifying circuit for differentially receiving an output of said diode detector circuit and outputting a differential output signal; and a common mode feedback circuit for controlling said differential amplifying circuit in such a manner that a voltage corresponding to a mid-point of said differential output signal from said differential amplifying circuit will take on a voltage identical with a prescribed voltage; and a differential-input/single-ended output amplifier for differentially receiving the differential output signal from said differential amplifying circuit and outputting a single-ended output signal.

In the present invention, the detector circuit further comprises a binarization circuit for receiving the output signal of the differential-input/single-ended output amplifier and comparing the output signal with a threshold voltage to thereby binarize and output the signal, wherein the threshold voltage is adjustable.

In the present invention, the differential amplifying circuit includes: a first differential pair, which is driven by a first current source, for differentially receiving the output from the diode detector circuit; and a load circuit of the first differential pair; wherein the load circuit includes a first transistor pair having commonly connected control terminals. The common mode feedback circuit has second and third differential pairs driven by second and third current sources, respectively, and sharing a load circuit in common. The prescribed voltage is supplied commonly to one input of an input pair of the second differential pair and to one input of an input pair of the third differential pair; the other input of the input pair of the second differential pair and the other input of the input pair of the third differential pair are connected to respective ones of outputs of an output pair of the first differential pair; and one output, which corresponds to the one input of the input pair of the second differential pair, of an output pair of the second differential pair, and one output, which corresponds to the one input of the input pair of the third differential pair, of an output pair of the third differential pair, are connected to each other. One output, which corresponds to the other input of the input pair of the second differential pair, of the output pair of the second differential pair, and one output, which corresponds to the other input of the input pair of the third differential pair, of the output pair of the third differential pair, are connected to each other. One output of the commonly connected output pairs of the second and third differential pairs is connected to commonly connected control terminals of the first transistor pair, which constructs the load circuit of the first differential pair.

In the present invention, the differential-input/single-ended output amplifier includes: a fourth differential pair for differentially receiving the differential output signal of the differential-input/differential output amplifier with the common mode feedback circuit; a load circuit of the fourth differential pair, wherein the load circuit of the fourth differential pair has a second transistor pair, which is connected between an output pair of the fourth differential pair and a first power supply and has commonly connected control terminals; a first transistor connected between the commonly connected control terminals of the second transistor pair and a second power supply; a second transistor and a fourth current source serially connected between the first and second power supplies; and a third transistor and a fifth current source serially connected between the first and second power supplies; wherein the second and third transistors have control terminals connected to respective ones of outputs of an output pair of the fourth differential pair, the first transistor has a control terminal connected to a node of the second transistor and fourth current source, and a single-ended output signal is output from one output of the output pair of the fourth differential pair.

In the present invention, the binarization circuit includes: a fifth differential pair driven by a sixth current source for differentially receiving the output signal of the differential-input/single-ended output amplifier and the threshold voltage; a first current mirror circuit having an input side connected to one output of an output pair of the fifth differential pair; a second current mirror circuit having an input side connected to another output of the output pair of the fifth differential pair and an output side connected to an output terminal; and a third current mirror circuit having an input side connected to an output side of the first current mirror circuit and an output side connected to the output terminal; wherein a transistor on the output side of the second and third current mirror circuits drives the output terminal to a binary value.

In accordance with the present invention, a deterioration in CMRR and PSRR in a differential amplifier of a diode-detection signal is avoided and stable operation is made possible when a high gain is set.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

PREFERRED MODES OF THE INVENTION

The present invention will be described in greater detail with reference to the accompanying drawings. In the present invention, a differential-input/differential output amplifier with a common mode feedback (CMFB) circuit is provided between a diode detector circuit and an amplifier circuit to perform fully differential transformation of a differential signal, thereby improving the CMRR and PSRR.

Figure 6:
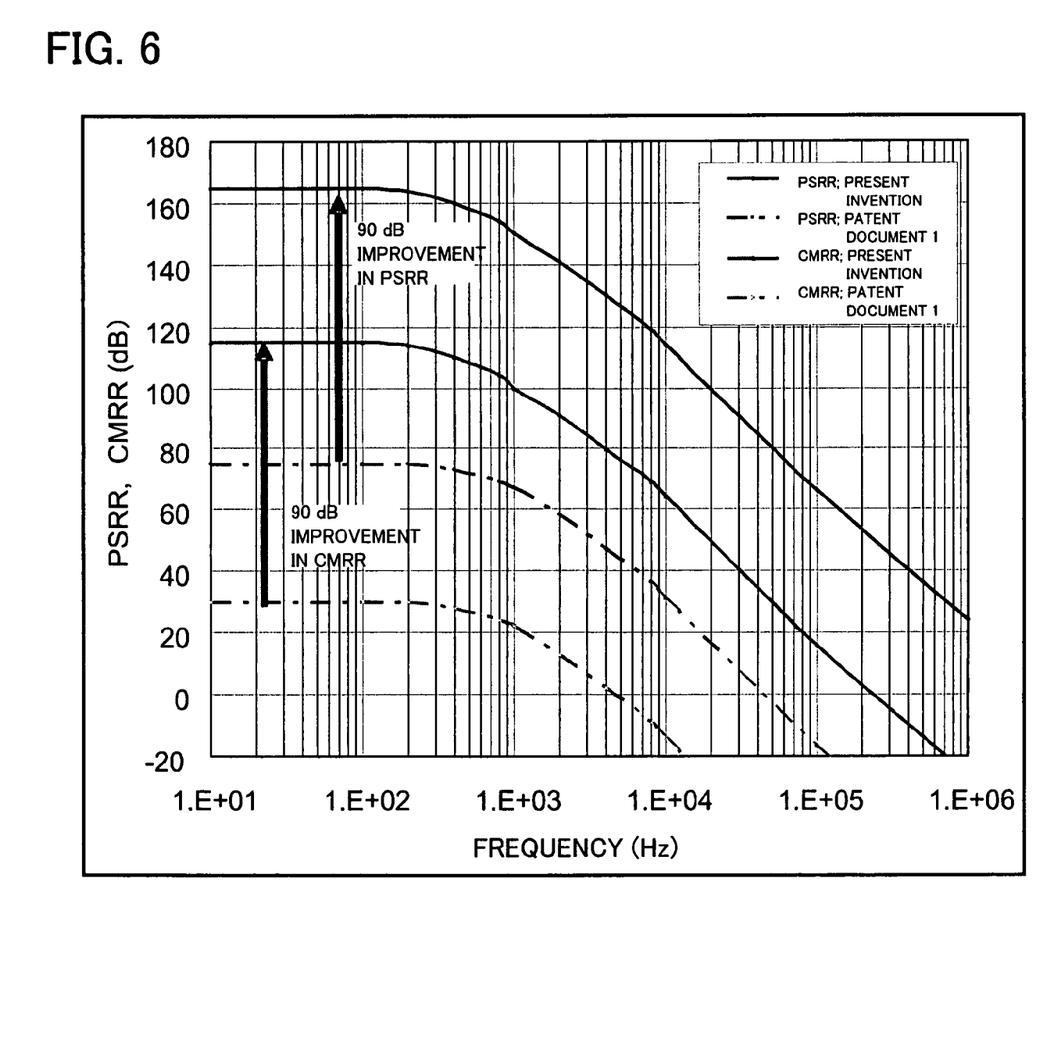
FIG. 6 is a diagram contrasting the characteristics (PSRR and CMRR) of the present invention and of Patent Document 1.

FIG. 6 illustrates an example of results obtained by improving characteristics (CMRR and PSRR characteristics) in accordance with the present invention. As an example for comparison purposes, FIG. 6 also illustrates the characteristics (CMRR and PSRR characteristics) of the circuit shown in FIG. 7. It is expected that total voltage gain with the circuit of FIG. 7 is 90 to 100 dB.

With the circuit configuration of Patent Document 1 illustrated in FIG. 7, CMRR and PSRR are 35 dB and 75 dB, respectively. This is one indicator that represents the performance of a multistage differential amplifier. In order to provide stable operation, the following must hold for the amplifier:

Total Gain (differential signal gain)<CMRR
Total Gain (differential signal gain)<PSRR Even if the total gain of the amplifier is high, the signal desired to be amplified cannot be amplified unless the common mode rejection ratio of a disturbance and noise, etc., is high.

The end result, therefore, is that a signal of a component not desired to be amplified is amplified. The same holds true for the PSRR as well. In a case where a component such as disturbance or noise has been impressed upon power supply voltage, if the PSRR is poor, the signal component that has been impressed upon the power supply voltage will be amplified rather than the signal that is desired to be amplified.

In the circuit according to Patent Document 1, two stages of differential-input/single-ended output amplifiers are connected in parallel. Consequently, the CMRR and PSRR are decided by the characteristics of the amplifier in the first stage and the characteristics of the CMRR and PSRR of the differential amplifier of the second stage are not added on. When it is attempted to obtain a high signal detection sensitivity, therefore, the more it is attempted to raise the gain of the entire amplifier circuit (the total gain), the more the PSRR and CMRR deteriorate. The result is unstable circuit operation.

By contrast, in accordance with the present invention, as evident from FIG. 6, both the CMRR and PSRR are improved by more than 90 dB in comparison with the characteristics according to Patent Document 1.

In accordance with the detector circuit of the present invention, even if the total voltage gain of the amplifier is made 90 to 100 dB, which is the same as that of the circuit of FIG. 7, the following will hold:

Total Gain (differential signal gain)<CMRR
Total Gain (differential signal gain)<PSRR and hence a characteristic that fully enables stable operation is obtained.

The setting of a threshold voltage in the input section of a binarization circuit (comparator circuit) according to the present invention will be described.

Figure 1:
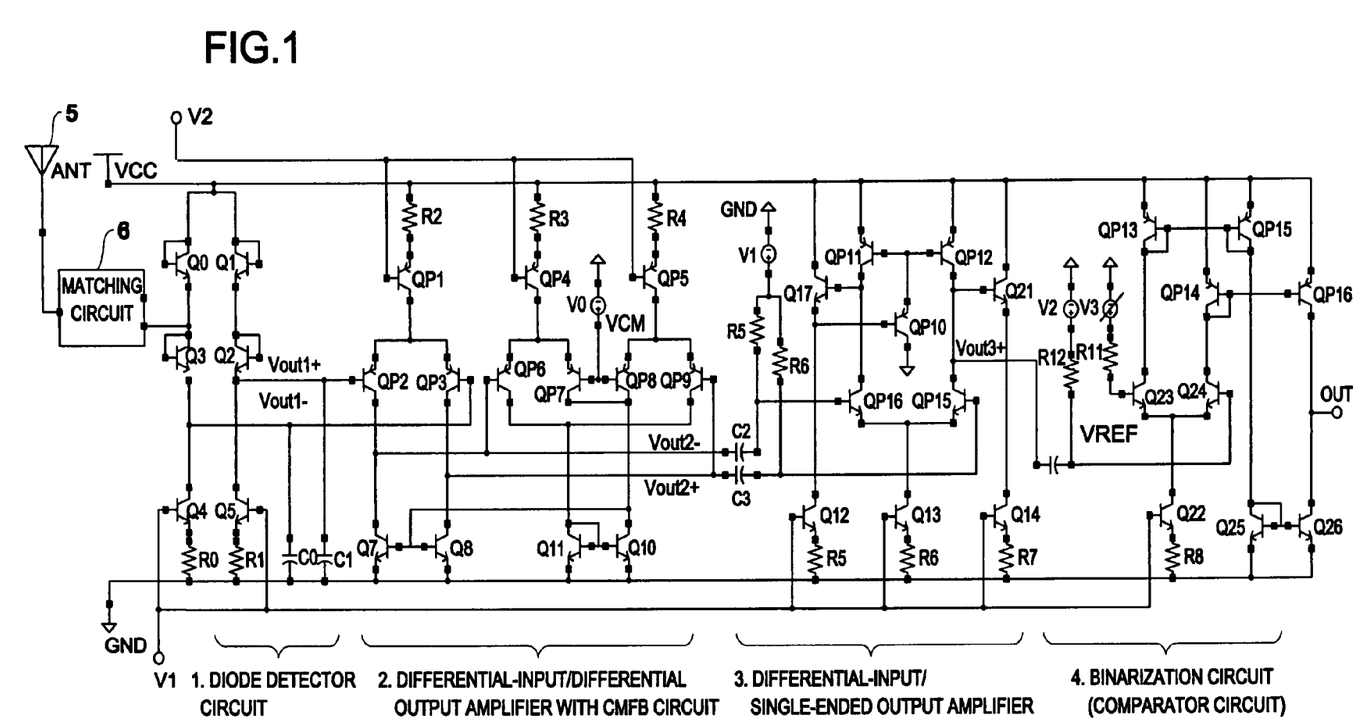
FIG. 1 is a diagram illustrating the configuration of a first example of the present invention.

In the present invention, as illustrated for example in FIG. 1, an amplitude-modulated signal that has been detected by a diode detector circuit 1 is amplified by a two-stage amplifier, namely by a differential-input/differential output amplifier 2 with a CMFB circuit and a differential-input/single-ended output amplifier 3, and the amplified signal is output as a signal Vout+3. The signal Vout+3 is supplied to a binarization circuit (comparator circuit) 4, which produces a digital output. With regard to the output signal Vout+3 of the differential-input/single-ended output amplifier 3, if we let P(Nout3) represent the noise power of the output signal Vout, then P(Nout3) will be given by Equation (1) below based upon the voltage gain G and noise factor NF of the diode detector circuit 1, differential-input/differential output amplifier 2 with CMFB circuit and differential-input/single-ended output amplifier 3.

$$P(Nout3)(dBm/Hz)=kTB+G+NF \tag{1}$$

where k represents the Boltzmann constant, T the temperature (K) and B the gain bandwidth (−3 dB band) of the amplifier.

Unless the threshold voltage of the input section of the binarization circuit 4 is set taking the noise voltage of the output signal Vout3+ into consideration, the output signal of the binarization circuit 4 will cause malfunction owing to noise. It should be noted that this is obtained as output noise voltage V(Nout3) from the noise power P(Nout3) of Vout+3.

Figure 2A:
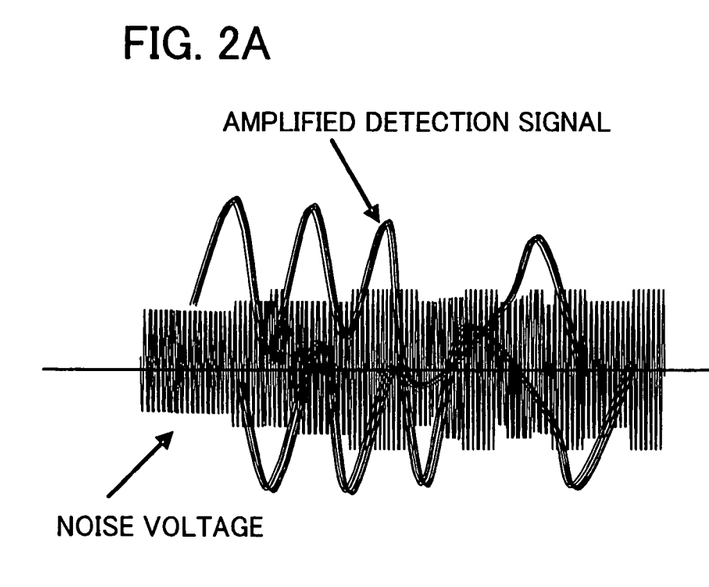
FIGS. 2A and 2B are diagrams for describing an output signal waveform of Vout3+ and the setting of a threshold value of a binarization circuit, respectively.

FIG. 2A illustrates the output signal waveform (amplified detection signal) of Vout3+ in FIG. 1. A noise voltage is being output upon Vout+3 at all times. In order to avoid malfunction, the threshold value of the binarization circuit 4 is set taking the noise value into consideration.

Figure 2B:
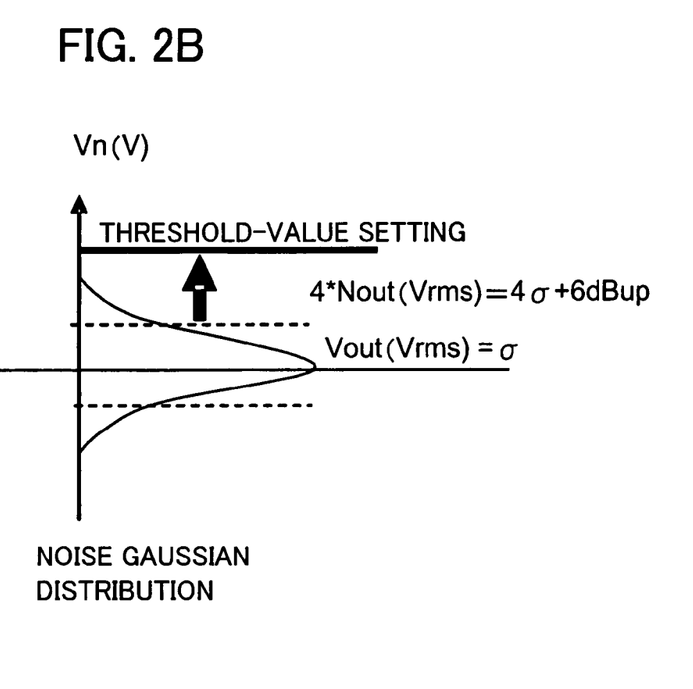

In a case where the above-mentioned output noise voltage V(Nout3) is obtained, the voltage will take on a voltage value equivalent to σ (the standard deviation) if the noise voltage is assumed to have a Gaussian distribution (see FIG. 2B).

In a case where the noise voltage distribution is considered, malfunction of the binarization circuit 4 will be prevented if the value that is four times or more as large as σ is adopted as the threshold value of the input difference voltage of the binarization circuit 4.

The present invention is a high-frequency detector circuit which receives an amplitude-modulated signal or an intermittent signal as an input, detects a value conforming to the input signal amplitude using a diode detector circuit, and outputs the detection signal amplitude information as the output signal of the detector circuit in the form of a digital signal. In a radio communication device of an RFID system, ZigBee or DSRC system, etc., the present invention is effective for use in a circuit that outputs a trigger signal for operating a transceiver circuit when a high-frequency signal is received.

Thus, in the present invention, in relation to the problem of the CMRR and PSRR, the differential-input/differential output amplifier 2 with CMFB circuit is used in the initial stage of the amplifying circuit and a differential signal undergoes fully differential conversion, so that the CMRR and PSRR are improved greatly to stabilize the circuit operation.

With regard to the setting of the threshold voltage of the input section of the binarization circuit (comparator circuit) 4, a difference voltage that is four times the noise voltage calculated based upon the voltage gain and noise factor NF of the overall detector circuit is adopted as the threshold value of the binarization circuit (comparator) 4, thereby preventing malfunction of the binarization circuit (comparator) 4.

An example of the present invention will be described with reference to FIG. 1. A high-frequency signal received by an antenna 5 is supplied to the diode detector circuit 1 via an impedance matching circuit 6.

In the diode detector circuit 1 of the input section, a first series circuit composed of diode-connected NPN bipolar transistors Q0, Q3 and a capacitor C0 is disposed between a power supply Vcc and ground GND, and a series circuit composed of an NPN bipolar transistor (current source) Q4 and a resistor R0 is connected between the emitter of transistor Q3 and ground GND. Further, a second series circuit composed of diode-connected NPN bipolar transistors Q1, Q2 and a capacitor C1 is disposed between the power supply Vcc and ground GND, and series circuit composed of an NPN bipolar transistor (current source) Q5 and a resistor R1 is connected between the emitter of transistor Q2 and ground GND. A common bias voltage V1 is applied to the transistors Q4 and Q5. This detector circuit is a half-wave/voltage doubling-type diode detector circuit similar to that of the circuit shown in FIG. 7.

The diode detector circuit performs envelope detection, i.e., demodulates the amplitude-modulated signal and detects an AM-type burst (intermittent) signal component with regard to a certain frequency carrier. The constant current source is capable of being set to an optimum bias point in such a manner that the efficiency of half-wave voltage doubling diode detection will be maximized.

The transistors Q0 and Q1 constitute a diode detector circuit to which the high-frequency signal is not applied, are arranged symmetrically with respect to the load of the input section of the differential-input/differential output amplifier 2 and are disposed so as to improve the CMRR and PSRR.

The amplifying section that is arranged on a stage following the diode detector circuit 1 is the differential-input/differential output amplifier 2 with the common mode feedback (CMFB) circuit.

In this example, the differential-input/differential output amplifier 2 with CMFB circuit includes a differential pair of PNP transistors QP2 and QP3 in order to realize low-voltage operation, and as the load thereof NPN transistors Q7 and Q8. That is, the differential-input/differential output amplifier 2 with CMFB circuit includes: differential pair transistors QP2 and QP3 having their emitters coupled together; a current source transistor QP1 and a resistor R2 connected in series between the coupled emitters of the differential pair transistors QP2 and QP3 and power supply Vcc; and transistors Q7 and Q8 connected between the outputs (collectors) of the differential pair transistors QP2 and QP3, respectively, and ground and having their bases connected together. The terminal voltages of capacitors C0 and C1 are supplied to the bases of the differential pair transistors QP3 and QP2, respectively. With regard to the reference characters of the transistors, a "QP" transistor is a PNP-type transistor and a "Q" transistor is an NPN-type transistor.

The differential-input/differential output amplifier 2 with CMFB circuit further includes: differential pair transistors QP6 and QP7 having their emitters coupled together; a current source transistor QP4 and a resistor R3 connected in series between the coupled emitters of the differential pair transistors QP6 and QP7 and power supply Vcc; differential pair transistors QP8 and QP9 having their emitters coupled together; and a current source transistor QP5 and a resistor R4 connected in series between the coupled emitters of the differential pair transistors QP8 and QP9 and power supply Vcc. The output pair (collector pair) of the differential pair transistors QP6 and QP7 and the output pair (collector pair) of the differential pair transistors QP8 and QP9 are connected to a current mirror circuit (Q10, Q11), which is a common load circuit of differential pair transistors (QP6, QP7) and (QP8, QP9). That is, the collectors of the transistors QP6 and QP9 are coupled together, the collectors of the transistors QP7 and QP8 are coupled together, the transistor Q11 is provided between the common node of the collectors of the transistors QP6 and QP9 and ground, and the transistor Q10 is provided between the common node of the collectors of the transistors QP7 and QP8 and ground. The bases of the transistors QP7 and QP8 are coupled together and connected to one end (the output end) of a voltage source V0 (common mode voltage VCM), and the bases of the transistors QP6 and QP9 are connected to the collectors of the differential pair transistors QP2 and QP3, respectively. Further, the collector of the transistor Q10 is connected to the bases of transistors Q7 and Q8. The other end of the voltage source V0 is connected to ground.

The mid-point voltage of the differential output signal (Vout2−, Vout2+) from the collectors of the differential pair transistors (QP2, QP3), is detected by an amplifier comprising the differential pairs (QP6, QP7, QP8, QP9) and passive loads (Q10, Q11), and common mode feedback is provided for feeding the result of detection back to the bases of the transistors Q7 and Q8, which form the load circuit of the differential pair transistors QP2 and QP3. Feedback control is performed in such a manner that the mid-point voltage (average voltage) of the differential signals Vout2− and Vout2+ becomes a voltage identical with the voltage VCM. The handling of the input and output differential signals is realized by such an arrangement. In this example, the bias voltage of the passive load elements of the differential pairs is feedback-controlled based upon the output of the CMFB circuit in such a manner that the mid-point voltage of the differential output signal of the differential amplifier will become equal to the voltage VCM. However, it may be so arranged that the current sources that drive the differential pairs are controlled and the mutual conductance gm of the differential amplifier is varied based upon the output of the CMFB circuit.

The differential output signal (Vout2+, Vout2−) is supplied to the differential-input/single-ended output amplifier 3.

The differential-input/single-ended output amplifier 3 includes: differential pair transistors Q15 and Q16 having their emitters coupled together; a current source transistor Q13 and a resistor R6 connected between the coupled emitters of the differential pair transistors Q15, Q16 and ground GND; and transistors QP11 and QP12 connected Between the outputs (collectors) of the differential pair transistors Q15 and Q16, respectively, and the power supply Vcc and having their bases connected together. A transistor QP10 is provided between the commonly connected bases of the transistors QP11 and QP12 and ground GND. A series circuit composed of a transistor Q17, a transistor Q12 and a resistor R5 is provided between the power supply Vcc and ground, the base of the transistor Q17 is connected to the collector of the transistor QP11, and the base of the transistor Q17 is connected to bias voltage V1. A series circuit composed of a transistor Q21, a transistor Q14 and a resistor R7 is provided between the power supply Vcc and ground, the base of the transistor Q21 is connected to the collector of the transistor QP12, and the base of the transistor Q14 is connected to the bias voltage V1.

The bases of the transistors Q16 and Q15 are connected to connection nodes between one ends of resistors R5 and R6 and capacitors C2 and C3, respectively, and the other ends of the resistors R5 and R6 are commonly connected to one end (the output end) of voltage source V1. In this example, the other end of the voltage source V1 is connected to ground.

Furthermore, in this example, a transistor QP10 for base current compensation is provided in order to avoid an imbalance in the operating point owing to the low hFE (direct current amplification factor) of the PNP transistors. Since the operating point is lowered by the transistor QP10 by the amount of VBE (base-to-emitter voltage), NPN transistor Q17 is provided so as to make low-voltage drive possible, and the circuit arrangement is such that the operating point is restored by the amount of VBE_Q17.

Further, transistor Q21 is provided in a symmetrical arrangement in order to keep the DC operating point in balance with the transistor Q17, and it is so arranged that the DC potential of the output Vout3+ will not be saturated owing to a DC imbalance of the operational amplifier itself.

The detection signal Vout+3 that has been amplified by the circuitry from the diode detector circuit 1 to the amplifier 3 is supplied to the binarization circuit 4 constituting the final stage. The binarization circuit 4 converts the applied detection signal Vout+3 to a low (0V)/high (VCC) binary signal and outputs the detection signal in the form of this binary signal.

The binarization circuit 4 includes: differential pair transistors Q23 and Q24 having their emitters coupled together; a current source transistor Q22 and a resistor R8 connected between the coupled emitters of the differential pair transistors Q23 and Q24 and ground GND; and diode-connected transistors QP13 and QP14 connected between the outputs (collectors) of the differential pair transistors Q23 and Q24, respectively, and the power supply Vcc. A threshold voltage VREF is supplied to the transistor Q23. That is, the base of the transistor Q23 is connected to a voltage source V3 (of variable voltage type) via a resistor R11. Further, the base of the transistor Q24 is connected to a voltage source V2 via a resistor R12. The transistors QP13 and QP15 form a current mirror, in which the transistor QP13 receives the collector current of the transistor Q23 and the transistor QP15 supplies a mirror current to a current mirror comprising transistors Q25 and Q26. The transistor Q25 receives the current from the transistor QP15 and the transistor Q26 drives (discharges) the output terminal OUT with a mirror current. The transistors QP14 and QP16 form a current mirror, in which the transistors QP14 receives the collector current of the transistor Q24 and the transistor Q16 drives (charges) the output terminal OUT. A low (ground potential: 0V)/high (power supply potential: VCC) detection signal appears at the output terminal OUT.

By adjusting the threshold voltage VREF of the binarization circuit 4 depending upon the status of the S/N ratio of the output signal Vout+3 of the amplifier 3, separation into a signal and noise is achieved and only the signal component is extracted, thereby preventing malfunction of the binarization circuit 4.

In the example of the configuration shown in FIG. 1, use is made of bipolar transistors. Naturally, however, CMOS transistors may be used in the amplifiers 2, 3 and binarization circuit 4.

The operation of this example will now be described. The high-frequency signal received by the antenna 5 is supplied to the diode detector circuit 1 via the impedance matching circuit 6. As mentioned above, the diode detector circuit 1 is a half-wave voltage doubling diode detector circuit (two stages of NPN diodes) and includes constant current sources, and the output section has the capacitors C0 and C1 for smoothing voltage. The diode detector circuit 1 is such that when current is reduced for low-current operation, impedance (the resistance component) rises, thermal noise is produced, the noise factor deteriorates and detection sensitivity declines. In order to improve reception detection sensitivity, it is necessary to optimize the signal detection efficiency of the diode detector circuit 1 and to optimize the current setting of the constant current sources (Q4 and R0, Q5 and R1) for the purpose of lowering noise.

Figure 3A:
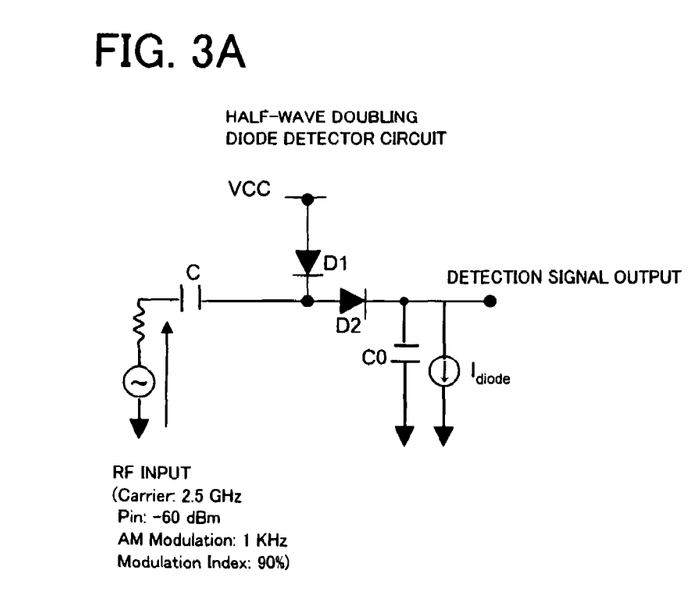
FIGS. 3A, 3B and 3C are diagrams illustrating a diode detector circuit (of half-wave doubling type), an input signal and an output detection signal, respectively.
Figure 3B:
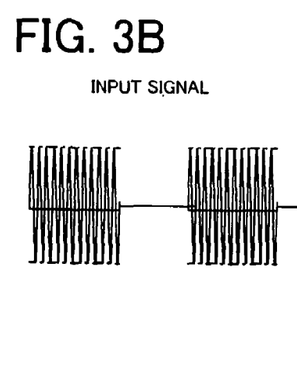
Figure 3C:
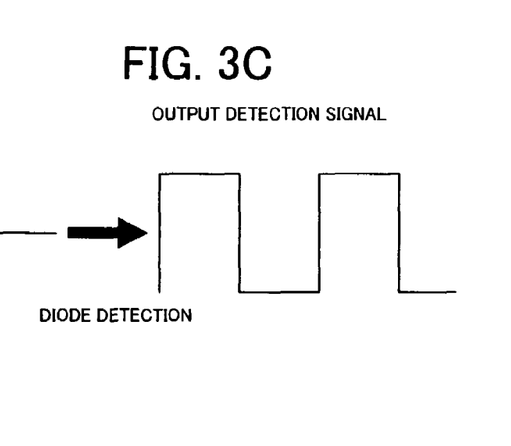

FIGS. 3A, 3B and 3C illustrate the operating principle of the diode detector circuit (of half-wave voltage doubling type) in the example shown in FIG. 1. The diode detector circuit 1 includes a series circuit, which comprises diodes D1, D2 and capacitor C0, connected between the power supply Vcc and ground. The input signal is applied to the anode of the diode D2, and the cathode of the diode D2 is connected to a current source. The diode detector circuit 1 performs envelope detection, demodulates the amplitude-modulated (AM) signal and detects an AM-type burst (intermittent) signal component with regard to a certain frequency carrier. The output detection signal in FIG. 3C is output with regard to the input signal of FIG. 3B.

Figure 4A:
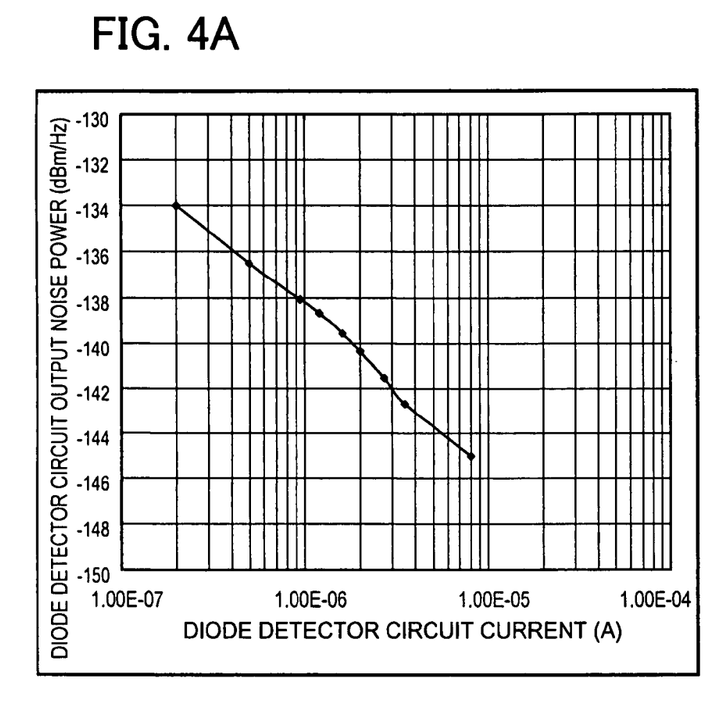
FIGS. 4A and 4B are diagrams illustrating an output noise voltage characteristic and a detection signal output voltage characteristic, respectively, of a diode detector circuit.
Figure 4B:
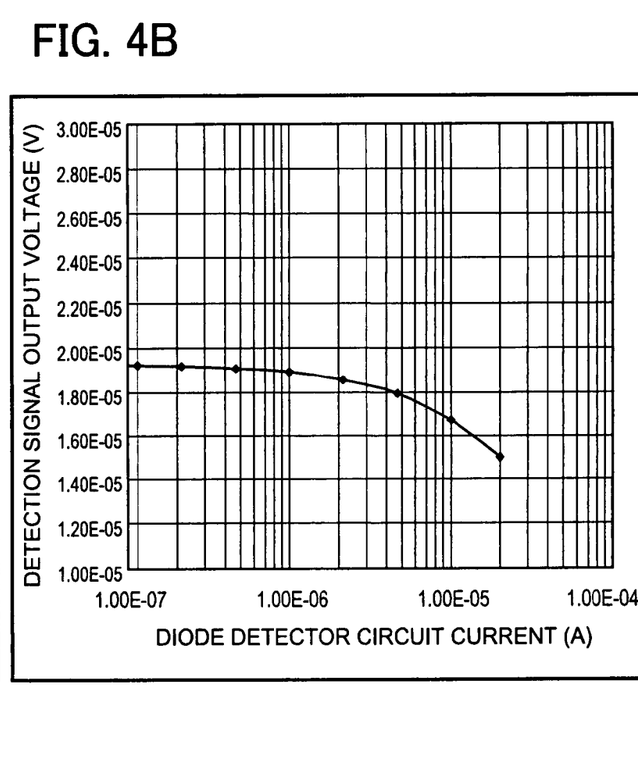

FIGS. 4A and 4B illustrate an example of diode detection characteristics relating to the signal setting shown in FIG. 3A. Specifically, these are the results of a simulation when the following settings were made for the high-frequency signal:
  carrier frequency: 2.5 GHz;
  AM modulation: 1 KHz;
  modulation index: 90%; and
  input power: −60 dBm.

FIG. 4A is a graph illustrating the relationship between the current of the diode detector circuit and the output noise power (dBm/Hz) of the diode detector circuit, and FIG. 4B is a graph illustrating the relationship between the current of the diode detector circuit and detection signal output voltage (V).

As illustrated in FIGS. 4A and 4B, the diode noise characteristic is improved by increasing current, but detection efficiency declines if too much current is passed. Both of these actions are related to the noise factor and influence reception detection sensitivity. This example takes both characteristics into consideration and sets the current of the diode detector circuit 1 to about 2 uA, although this does not impose any particular limitation. This set value of current takes into consideration a balance between consumed current and reception sensitivity.

In this example, the differential-input/differential output amplifier 2 with CMFB circuit is provided as the stage following the diode detector circuit 1 so as to make low-voltage drive possible. The CMFB circuit, which includes differential circuits comprising the transistors QP2, QP3, Q7 and Q8, detects the average value of differential output voltages from the output pair of the differential pair transistors QP2 and QP3 (from the commonly coupled collectors of transistors QP2 and Q7 and commonly coupled collectors of transistors QP3 and Q8), returns the signal to the bases of the transistors Q7 and Q8, and controls the base voltage of the transistors Q7 and Q8, thereby making it possible to handle input/output signals fully differentially.

In accordance with this example, the CMRR and PSRR are improved by such an arrangement, stable operation becomes possible at the time of high gain and a high reception sensitivity is obtained as a result.

Further, in an actual manufacturing process, an offset voltage produced from an imbalance in transistor characteristics must be taken into account. Assume that the input offset voltage of the amplifier itself is on the order of 1 mV, and consider circuit operation up to a power supply voltage of 1.6V. Unless the maximum voltage gain of each amplifier stage is set to 50 dB, the output DC potentials of the output pair of the differential pair transistors QP2 and QP3 (of the common collector of transistors QP2 and Q7 and common collector of transistors QP3, Q8) will develop an output offset voltage by an amount equivalent to (input offset voltage)× (amplifier voltage gain), and the desired voltage gain may not be obtained owing to offset voltage saturation. Caution, therefore, is required.

In this example, the output differential signals Vout2 of the differential-input/differential output amplifier 2 with CMFB circuit is supplied to the differential-input/single-ended output amplifier 3. The amplifier 3 has the differential pair (NPN transistors Q15 and Q16), the passive load QP11 and QP12 of current mirror type and obtains a high voltage gain. As mentioned above, the transistor Q21 is provided in a symmetrical arrangement in order to keep the DC operating point in balance with the transistor Q17, and it is so arranged that the DC potential of the output Vout3+ will not be saturated owing to a DC imbalance of the operational amplifier itself. Caution must also be observed with regard to saturation of the output owing to input offset voltage with regard to the amplifier 3 as well.

With regard to the amplifiers 2 and 3, it is desired that the voltage gain of the two-stage amplifier be raised in order to obtain a high reception detection sensitivity. However, from the standpoint of amplifier saturation, which is due to amplifier offset voltage, and low-voltage drive, the optimum voltage gain of amplifiers 2 and 3 is 90 to 100 dB.

The detection signal Vout+3 amplified by the circuitry from the diode detector circuit 1 to the amplifier 3 is converted to a low (0V)/high (VCC) binary signal by the binarization circuit 4, and the resulting detection signal is output. The threshold voltage VREF of the binarization circuit 4 is adjustably set depending upon the status of the S/N ratio of the signal Vout+3, and the signal component is extracted. The SNR of the signal Vout3+ is given by Equation (1) cited earlier.

Figure 5A:
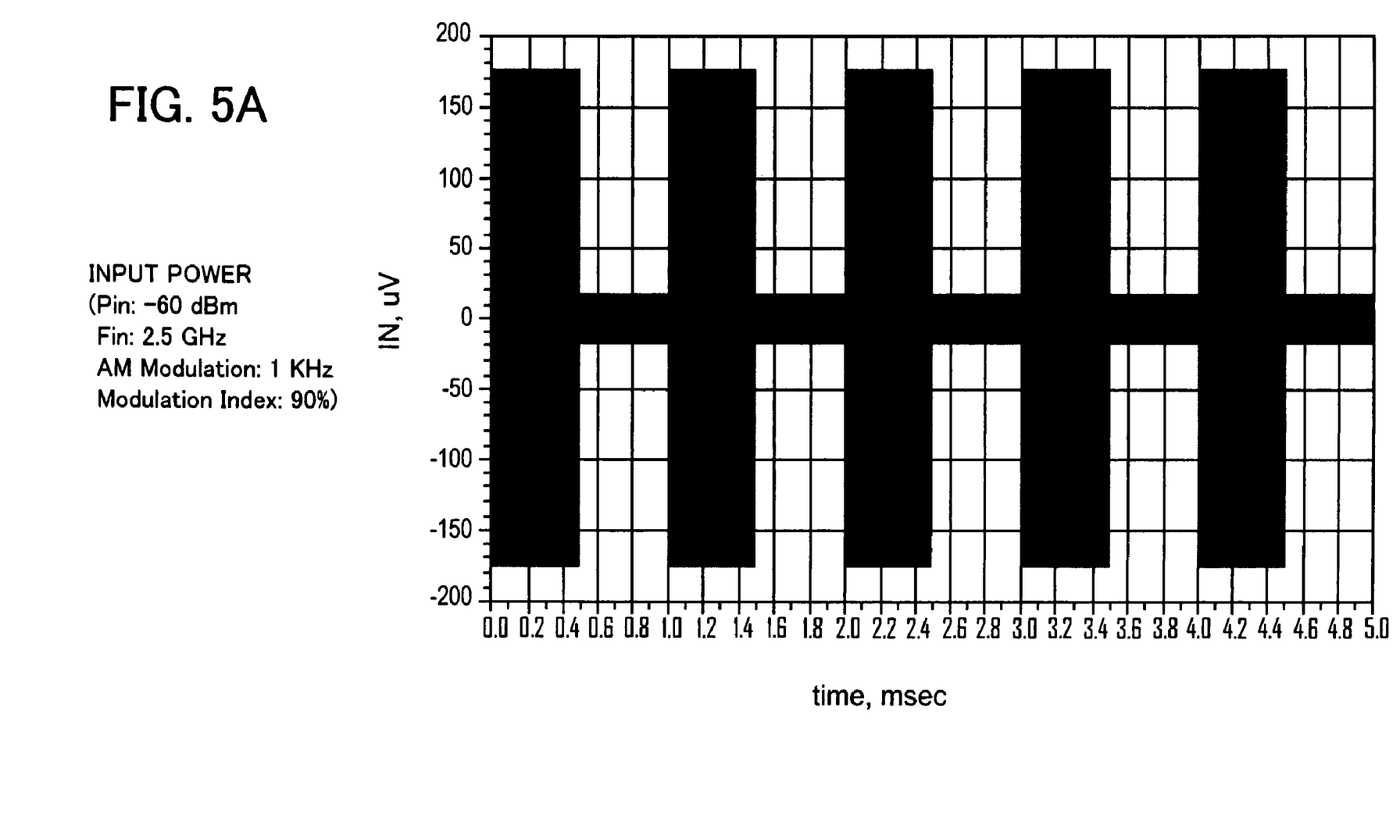
FIGS. 5A and 5B are diagrams illustrating an input signal waveform of a circuit simulation and an output signal waveform of the circuit simulation, respectively.
Figure 5B:
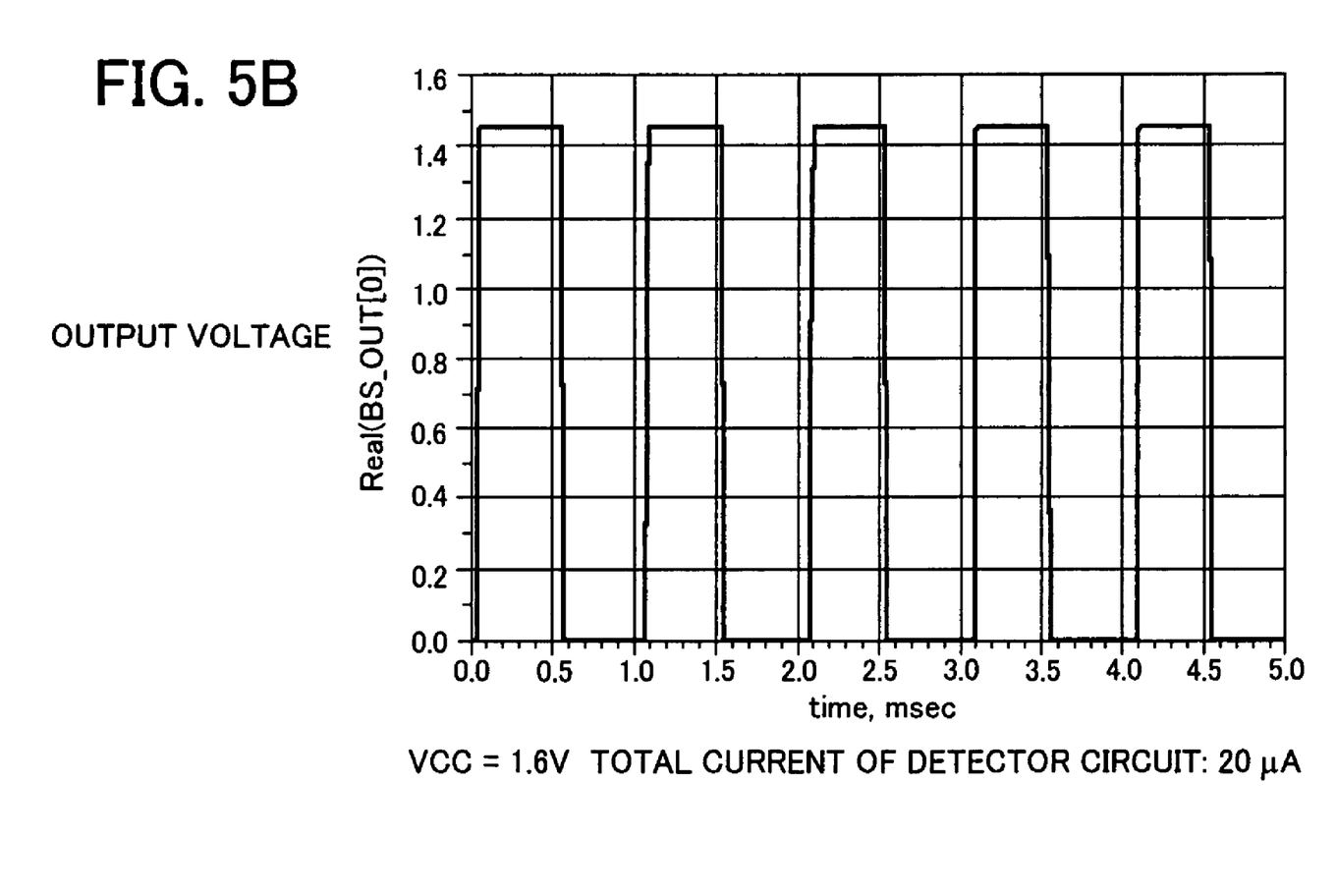

FIG. 5A is a diagram illustrating the input signal (carrier frequency: 2.5 GHz, AM modulation: 1 KHz, modulation index: 90%, input power: −65 dBm) of the simulation of the example shown in FIG. 1, and FIG. 5B is a diagram illustrating the output voltage waveform (voltage waveform at the output terminal OUT in FIG. 1) of the simulation. Here VCC=1.6V holds and the current of the overall detector circuit is 20[A.

The actions and effects of this example will now be described. In this example, in relation to the problem of CMRR and PSRR, the differential-input/differential output amplifier 2 with CMFB circuit is provided on the assumption that low-voltage drive is possible. The CMFB circuit detects the average value of the differential signal output voltages of the differential pair transistors QP2 and QP3 and controls the base voltages of the passive-load transistors Q7 and Q8, thereby making it possible to handle perfect input/output differential signals. By adopting a two-stage amplifier configuration, the CMRR and PSRR are improved, stable operation becomes possible at the time of high gain and a high reception sensitivity is obtained.

According to the present invention, low-voltage drive, low current and power consumption and higher reception detection sensitivity can be achieved during stable circuit operation in a high-frequency signal detector circuit for detecting a high-frequency signal. In a radio communication device of an RFID system, ZigBee or DSRC system, etc., the present invention is effective for use in a circuit that outputs a seizure signal for operating a transceiver circuit when a high-frequency signal is received.

Though the present invention has been described in accordance with the foregoing examples, the invention is not limited to these examples and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A high-frequency signal detector circuit comprising:
    a diode detector circuit comprising a single input and a differential output that performs envelope detection of a received signal;
    a differential-input/differential output amplifier with a common mode feedback circuit, said differential-input/differential output amplifier including:
        a differential amplifying circuit that differentially receives said differential output of said diode detector circuit and outputs a differential output signal; and
        a common mode feedback circuit that controls said differential amplifying circuit in such a manner that a voltage corresponding to a mid-point of said differential output signal from said differential amplifying circuit comprises a voltage identical with a prescribed voltage; and
    a differential-input/single-ended output amplifier that differentially receives the differential output signal from said differential amplifying circuit and outputs a single-ended output signal.

2. The high-frequency signal detector circuit according to claim 1, further comprising a binarization circuit that receives the output signal of said differential-input/single-ended output amplifier and compares the output signal with a predetermined threshold voltage to binarize and output the signal, wherein said threshold voltage is adjustably set.

3. The high-frequency signal detector circuit according to claim 1, wherein in said differential-input/differential output amplifier,
    said differential amplifying circuit comprising:
        a first differential pair driven by a first current source, said first differential pair differentially receiving the output from said diode detector circuit; and a load circuit connected to said first differential pair, said load circuit including a first transistor pair having commonly connected control terminals, said common mode feedback circuit comprising:

second and third differential pairs driven by second and third current sources, respectively, said second and third differential pairs sharing a load circuit in common, the prescribed voltage being supplied commonly to one input of an input pair of said second differential pair and to one input of an input pair of said third differential pair, the other input of the input pair of said second differential pair and the other input of the input pair said the third differential pair being connected to respective ones of outputs of an output pair of said first differential pair, one output, corresponding to the one input of the input pair of said second differential pair, of an output pair of said second differential pair, and another output, corresponding to the one input of the input pair of said third differential pair, of an output pair of said third differential pair, being connected to each other, one output, corresponding to the other input of the input pair of said second differential pair, of the output pair of said second differential pair, and another output, corresponding to the other input of the input pair of said third differential pair, of the output pair of said third differential pair, being connected to each other, and one output of the commonly connected output pairs of said second and third differential pairs being connected to commonly connected control terminals of a first transistor pair constituting the load circuit of said first differential pair.

4. The high-frequency signal detector circuit according to claim 1, wherein said differential-input/single-ended output amplifier includes:

a fourth differential pair that differentially receives the differential output signal from said differential-input/ differential output amplifier with the common mode feedback circuit;

a load circuit of said fourth differential pair, said load circuit including a second transistor pair connected between an output pair of said fourth differential pair and a first power supply and having commonly connected control terminals;

a first transistor connected between the commonly connected control terminals of said second transistor pair and a second power supply;

a second transistor and a fourth current source serially connected between the first and second power supplies; and a third transistor and a fifth current source serially connected between the first and second power supplies;

said second and third transistors having control terminals connected to respective ones of outputs of an output pair of said fourth differential pair;

said first transistor having a control terminal connected to a node of said second transistor and fourth current source; and a single-ended output signal being output from one output of the output pair of said fourth differential pair.

5. The high-frequency signal detector circuit according to claim 2, wherein said binarization circuit includes:

a fifth differential pair driven by a sixth current source, said fifth differential pair differentially receiving the output signal from said differential-input/single-ended output amplifier and the predetermined threshold voltage;

a first current mirror circuit having an input side connected to one output of an output pair of said fifth differential pair;

a second current mirror circuit having an input side connected to another output of the output pair of said fifth differential pair and an output side connected to an output terminal;

a third current mirror circuit having an input side connected to an output side of said first current mirror circuit and an output side connected to the output terminal; and transistors on output sides of said second and third current mirror circuits driving the output terminal to a binary value.

6. The high-frequency signal detector circuit according to claim 5, wherein said threshold voltage comprises a difference voltage at least four times as large as a noise voltage, in accord with a voltage gain and a noise factor of the overall detector circuit.

7. The high-frequency signal detector circuit according to claim 1, said differential amplifying circuit comprising:

a first differential pair driven by a first current source, said first differential pair differentially receiving the output from said diode detector circuit; and a load circuit connected to said first differential pair, said load circuit including a first transistor pair having commonly connected control terminals.

8. The high-frequency signal detector circuit according to claim 1, said common mode feedback circuit comprising:

second and third differential pairs driven by second and third current sources, respectively, said second and third differential pairs sharing a load circuit in common, the prescribed voltage being supplied commonly to one input of an input pair of said second differential pair and to one input of an input pair of said third differential pair, the other input of the input pair of said second differential pair and the other input of the input pair said the third differential pair being connected to respective ones of outputs of an output pair of said first differential pair, one output, corresponding to the one input of the input pair of said second differential pair, of an output pair of said second differential pair, and another output, corresponding to the one input of the input pair of said third differential pair, of an output pair of said third differential pair, being connected to each other, one output, corresponding to the other input of the input pair of said second differential pair, of the output pair of said second differential pair, and another output, corresponding to the other input of the input pair of said third differential pair, of the output pair of said third differential pair, being connected to each other, and one output of the commonly connected output pairs of said second and third differential pairs being connected to commonly connected control terminals of a first transistor pair constituting the load circuit of said first differential pair.

9. A radio frequency trigger signal output circuit comprising the high-frequency signal detector circuit according to claim 1.

10. The high-frequency signal detector circuit according to claim 4, wherein said control terminal of said second transistor is connected to an output of one transistor of said fourth differential pair, said control terminal of said third transistor is connected to an output of an other transistor of said fourth differential pair, and said single-ended output is connected to a node of said control terminal of said third transistor and said output of said other transistor of said fourth differential pair.

11. The high-frequency signal detector circuit according to claim 5, wherein said threshold voltage is input to a control terminal of one transistor of said fifth differential pair, said output signal from said differential-input/single-ended output amplifier is input to a control terminal of an other transistor of said fifth differential pair, an output of said first transistor of said fifth differential pair is connected to commonly connected control terminals of said first current mirror, and an output of said other transistor of said fifth differential pair is connected to commonly connected control terminals of said second current mirror.

12. The high-frequency signal detector circuit according to claim 1, said diode detector circuit comprising a half-wave voltage doubling diode detector circuit.

13. The high-frequency signal detector circuit according to claim 12, said envelope detection comprising:

demodulating an amplitude-modulated (AM) signal; and detecting an AM-type burst intermittent signal component with regard to a certain frequency carrier.

14. The high-frequency signal detector circuit according to claim 1, wherein said differential-input/differential output amplifier with said common mode feedback circuit performs a fully differential transformation of a differential signal.

15. The high-frequency signal detector circuit according to claim 6, wherein a distribution of said noise voltage comprises a Gaussian distribution, and a voltage value of said noise voltage comprises a standard deviation of said distribution of said noise voltage.

16. The high-frequency signal detector circuit according to claim 3, wherein said first current source is connected to commonly connected output terminals of said first differential pair, and output terminals of each transistor of said load circuit are connected to other output terminals of said first differential pair.

17. The high-frequency signal detector circuit according to claim 3, an other output of the commonly connected output pairs of said second and third differential pairs being commonly connected to control terminals of a pair of transistors constituting said load circuit shared in common of said second and third differential pairs.

18. The high-frequency signal detector circuit according to claim 3, wherein said first, second, and third current sources are controlled in accord with an output of the common mode feedback circuit.

19. The high-frequency signal detector circuit according to claim 3, wherein a mutual conductance of the differential amplifier is varied in accord with an output of the common mode feedback circuit.

20. The high-frequency signal detector circuit according to claim 4, wherein said second transistor and said third transistor provide a symmetrical arrangement such that a direct current (DC) operating point of said second transistor and said third transistor is kept in balance, thereby preventing a DC saturation of said single-ended output signal due to a DC imbalance of the differential-input/single-ended output amplifier.

* * * * *